United States Patent
Chou (10) Patent No.: US 7,961,919 B2
(45) Date of Patent: Jun. 14, 2011

(54) IMAGING DEVICE WITH SENSE AND COUPLE ELECTRODES

(75) Inventor: Bruce C. S. Chou, Hsin Chu (TW)

(73) Assignee: Egis Technology Inc., Taipei (TW)

( * ) Notice: Subject to any disclaimer, the term of this patent is extended or adjusted under 35 U.S.C. 154(b) by 0 days.

(21) Appl. No.: 12/572,956

(22) Filed: Oct. 2, 2009

(65) Prior Publication Data

US 2010/0084542 A1    Apr. 8, 2010

(30) Foreign Application Priority Data

Oct. 8, 2008 (TW) .............................. 97138647 A
Mar. 26, 2009 (TW) .............................. 98109837 A (51) Int. Cl.
*G06K 9/28* (2006.01)
(52) U.S. Cl. .................................................. 382/124
(58) Field of Classification Search ........................ None
See application file for complete search history.

(56) References Cited

U.S. PATENT DOCUMENTS

| 2003/0099380 A1* | 5/2003 | Gozzini | 382/124 |
| 2008/0069413 A1* | 3/2008 | Riedijk et al. | 382/124 |

* cited by examiner

*Primary Examiner* — Brian P Werner
(74) *Attorney, Agent, or Firm* — Muncy, Geissler, Olds & Lowe, PLLC (57) ABSTRACT

An imaging device for sensing an image of an object includes a negative feedback amplifier, a substrate, a sense electrode, a couple electrode and an insulation protection layer. The sense and couple electrodes are disposed above the substrate. The insulation protection layer covers the sense and couple electrodes. The sense electrode and the object form a sense capacitor. The couple electrode and the object form a couple capacitor. A negative input terminal of the negative feedback amplifier is directly electrically connected to the sense electrode, and the couple electrode is directly electrically connected to one of a signal output terminal of the negative feedback amplifier and a signal input terminal of the imaging device.

12 Claims, 9 Drawing Sheets

IMAGING DEVICE WITH SENSE AND COUPLE ELECTRODES

This application claims priority of No. 097138647 filed in Taiwan R.O.C. on Oct. 8, 2008 and priority of No. 098109837 filed in Taiwan R.O.C. on Mar. 26, 2009 under 35 USC 119, the entire content of which is hereby incorporated by reference.

BACKGROUND OF THE INVENTION

1. Field of the Invention

The invention relates in general to an imaging device, and more particularly to an imaging device for sensing skin textures.

2. Related Art

In the technology of sensing the capacitor of the skin of the human body, a fingerprint sensor for sensing the texture of the finger or a touch panel or a touch screen for capacitor touch control may be applied.

More particularly, the sensor for sensing the texture of the skin has a portion for contacting the texture of the skin, and the basic structure of the portion includes an array-type sensing member. That is, several sensing members having the same structure constitute a two-dimensional sensor array. For example, when the finger having ridges and valleys is placed thereon, the ridge is in direct contact with the sensor, and the valley is separated from the sensor by a gap. A two-dimensional capacitance image of the texture of the finger may be acquired according to the distances between the sensing members and the ridges and valleys, and this is the basic principle of the capacitive skin texture sensor.

In the most-frequently seen sensing member structure, the skin in contact with the sensor may be regarded as an electrode plate with the same potential due to the conductive property of the human body. Each sensing member is a plate electrode, and a capacitor may be formed between each sensing member and the skin. A dead skin layer of the skin of the finger and a sensor protection layer in direct contact with the dead skin layer are located between the two electrode plates. The protection layer may include a single insulating layer or multiple insulating layers and must have the properties of withstanding the environment erosion, the force impact and the electrostatic discharge.

In order to achieve the above-identified properties of the protection layer, the most direct method is to increase the thickness of the protection layer so that the property of the high intensity and the ability of withstanding the electrostatic discharge may be obtained. However, the too-thick protection layer causes the very small sense capacitance (C_cell) and thus decreases the sensing sensitivity.

SUMMARY OF THE INVENTION

It is therefore an object of the invention to provide an imaging device capable of effectively increasing the thickness of the protection insulating layer without decreasing the sensing sensitivity.

The invention achieves the above-identified object by providing an imaging device for sensing an image of an object. The imaging device includes a negative feedback amplifier, a substrate, a sense electrode, a couple electrode, an insulation protection layer and a reference electrode. The sense electrode is disposed above the substrate. The couple electrode is disposed above the substrate. The insulation protection layer covers the sense electrode and the couple electrode. The sense electrode and the object form a sense capacitor. The couple electrode and the object form a couple capacitor. A negative input terminal of the negative feedback amplifier is directly electrically connected to the sense electrode, and the couple electrode is directly electrically connected to one of a signal output terminal of the negative feedback amplifier and a signal input terminal of the imaging device.

According to the structure of the invention, it is possible to increase the thickness of the insulation protection layer, to increase the ability of withstanding the electrostatic discharge, and to increase the ability of withstanding the force impact.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
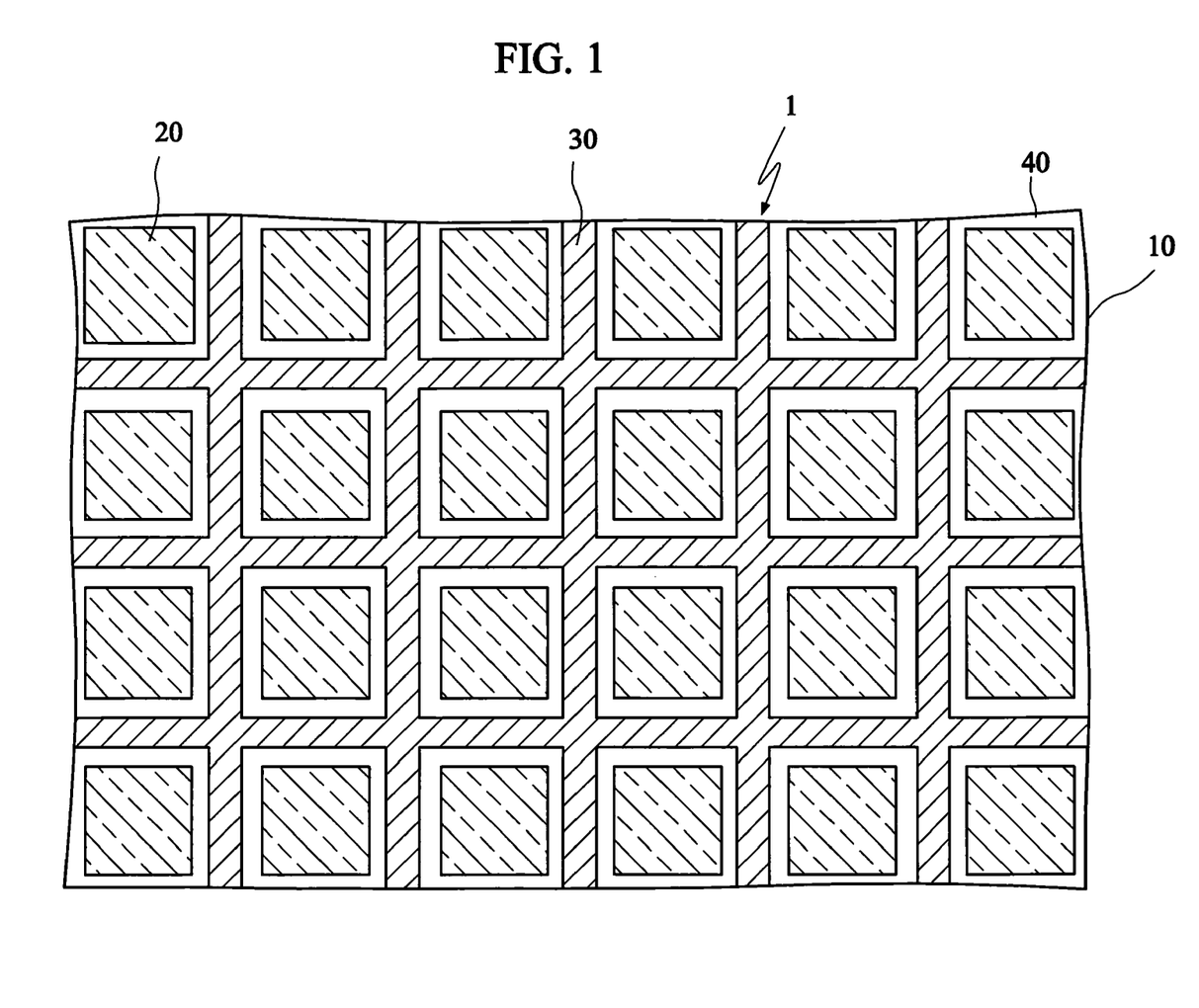
FIG. 1 is a schematic top view showing a portion of a sensing member array of an imaging device of the invention.
Figure 2:
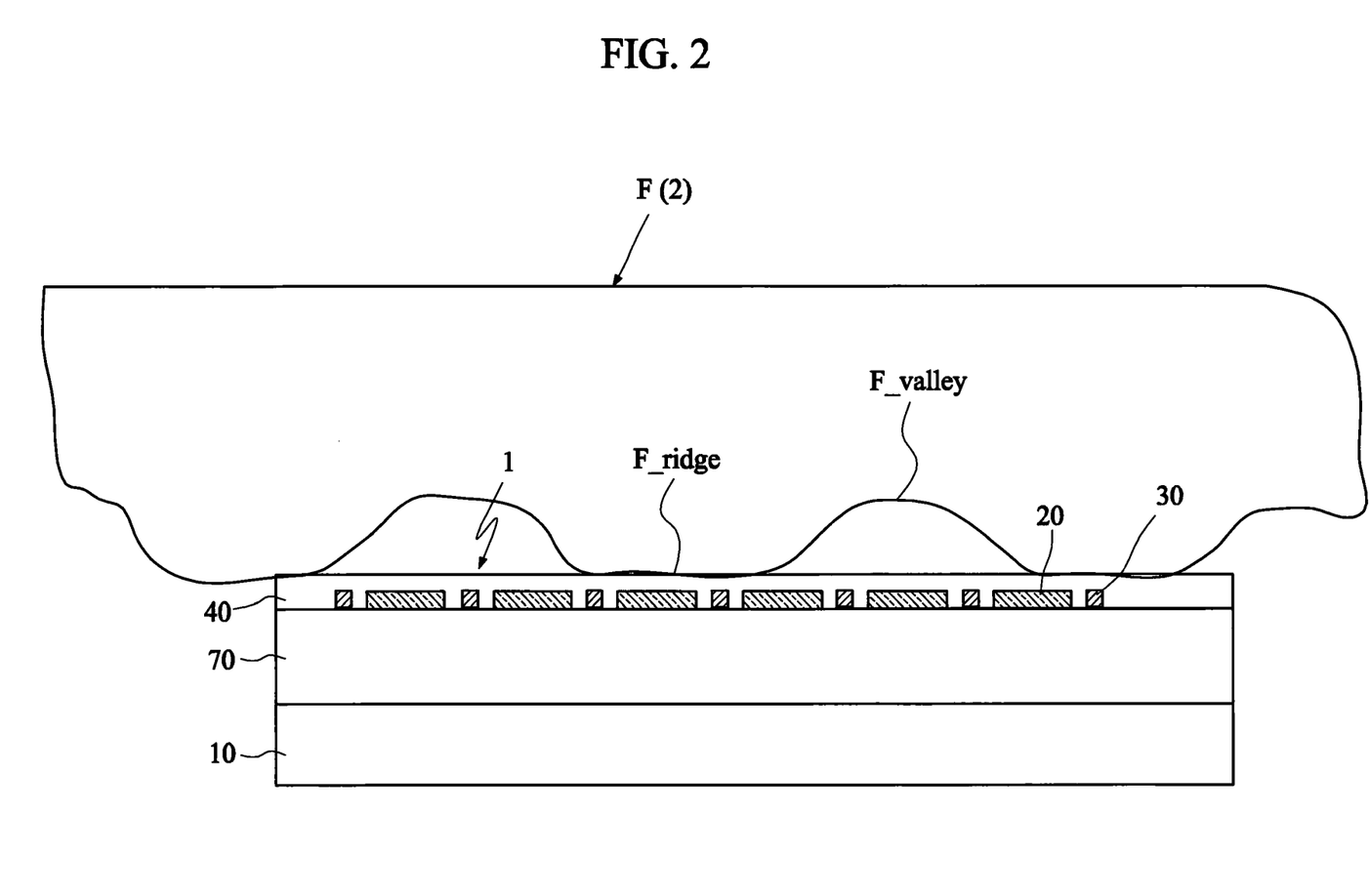
FIG. 2 is a schematic illustration showing the imaging device of the invention in a used state.
Figure 3:
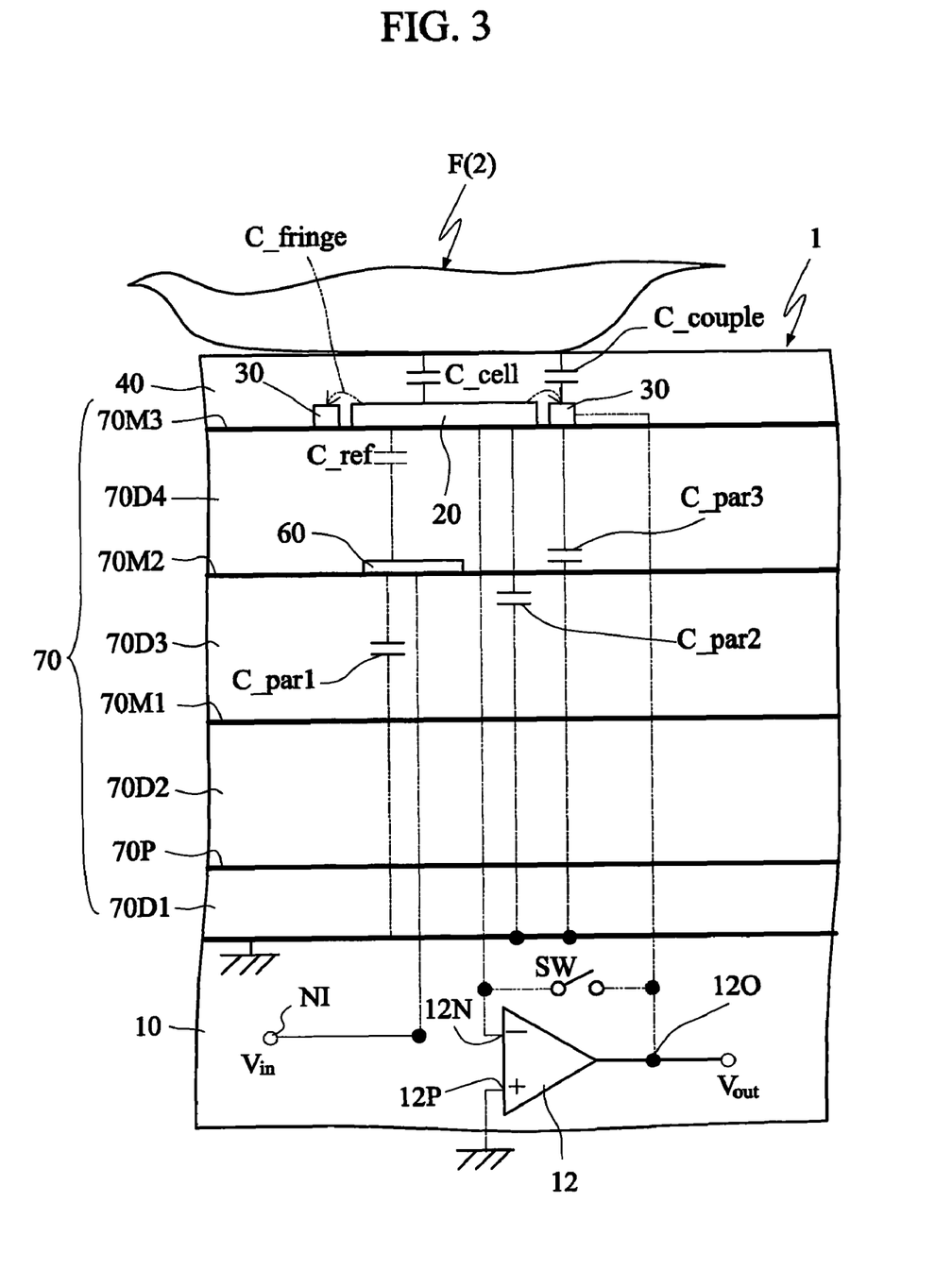
FIG. 3 is a schematic illustration showing an enlarged cross-section of a single sensing member according to a first embodiment of the invention.

FIG. 1 is a schematic top view showing a portion of a sensing member array of an imaging device 1 of the invention. FIG. 2 is a schematic illustration showing the imaging device of the invention in a used state. FIG. 3 is a schematic illustration showing an enlarged cross-section of a single sensing member according to a first embodiment of the invention. Referring to FIGS. 1 to 3, the imaging device 1 of this embodiment is for sensing an image of an object 2. The imaging device 1 includes at least a negative feedback amplifier 12, a substrate 10, a sense electrode 20, a couple electrode 30 and an insulation protection layer 40.

The material of the substrate 10 in this invention may be a silicon material, a glass material, other semiconductor materials or other insulation materials or polymer materials. The imaging device includes a sensing member array, composed of sensing members, to be in contact with a skin texture, and further includes a sense circuit, an amplifier circuit, an analog-to-digital converter circuit, a power control circuit and other control circuits corresponding to each sensing member. The sensing member structure and the reading circuit of the invention will be described in the following description, and the system structures of other circuits and the imaging device will not be described because those skilled in the art may easily understand.

When the material of the substrate 10 is the silicon material or any other semiconductor material, the negative feedback amplifier 12 and the other associated circuits may be formed in the substrate 10.

The sense electrode 20 and the couple electrode 30 are disposed above the substrate 10, that is, disposed on the same side of the substrate 10, and the couple electrode 30 is disposed around the sense electrode 20 at the same horizontal level or different horizontal levels.

The insulation protection layer 40 covers over the sense electrode 20 and the couple electrode 30. The sense electrode 20 and the object 2 disposed thereabove form a sense capacitor C_cell. The couple electrode 30 and the object 2 disposed thereabove form a couple capacitor IC_couple. A negative input terminal 12N of the negative feedback amplifier 12 is directly electrically connected to the sense electrode 20, and a signal output terminal 12O of the negative feedback amplifier 12 is directly electrically connected to the couple electrode 30.

In addition, the imaging device 1 may further include a reference electrode 60 disposed between the substrate 10 and the sense electrode 20, wherein a reference capacitor C_ref having the capacitance $C_{ref}$ is formed between the sense electrode 20 and the reference electrode 60. The reference electrode 60 is disposed below or under the sense electrode 20. The reference electrode 60 for receiving an input signal $V_{in}$ is electrically connected to a signal input terminal NI.

In addition, the imaging device 1 may further include a switch SW. The switch SW for resetting a potential between the sense electrode 20 and the couple electrode 30 is directly electrically connected to the negative input terminal 12N of the negative feedback amplifier 12 and the signal output terminal 12O of the negative feedback amplifier 12. When the material of the substrate 10 is the silicon material or any other semiconductor material, the switch SW may be formed in the substrate 10. A positive input terminal 12P of the negative feedback amplifier 12 is grounded. The imaging device 1 has an output signal $V_{out}$ at the signal output terminal 12O of the negative feedback amplifier 12.

When the material of the substrate of this embodiment is the semiconductor material, a composite layer 70 is filled between the insulation protection layer 40 and the substrate 10. The composite layer 70 includes a first dielectric layer 70D1, a polysilicon layer 70P, a second dielectric layer 70D2, a first metal layer 70M1, a third dielectric layer 70D3, a second metal layer 70M2, a fourth dielectric layer 70D4 and a third metal layer 70M3. The first dielectric layer 70D1 is disposed on the substrate 10. The polysilicon layer 70P is disposed on the first dielectric layer 70D1. The second dielectric layer 70D2 is disposed on the polysilicon layer 70P. The first metal layer 70M1 is disposed on the second dielectric layer 70D2. The third dielectric layer 70D3 is disposed on the first metal layer 70M1. The second metal layer 70M2 is disposed on the third dielectric layer 70D3. The fourth dielectric layer 70D4 is disposed on the second metal layer 70M2. The third metal layer 70M3 is disposed on the fourth dielectric layer 70D4.

In this embodiment, the sense electrode 20 is formed in the third metal layer 70M3, and the reference electrode 60 is formed in the second metal layer 70M2. A distance from the sense electrode 20 to the substrate 10 is equal to a distance from the couple electrode 30 to the substrate 10. That is, the sense electrode 20 and the couple electrode 30 are located at the same horizontal level. In another embodiment, the sense electrode 20 and the couple electrode 30 may be located at different horizontal levels.

Illustrations will be made by taking the finger as the object 2. In addition to sensing the fingerprint of the finger, the invention is also adapted to the sensing of any skin texture, any surface texture of an object, or the sensing of a capacitance formed by an object and a sensing member.

As shown in FIG. 2, when the finger F touches the imaging device 1, the ridge F_ridge and the valley F_valley of the finger F respectively touch and cover portions of the sense electrode 20. Each sense electrode 20 and each of the ridge F_ridge and the valley F_valley form the sense capacitor C_cell with the capacitance $C_{cell}$. For the sake of simplicity, $C_{ridge}$ represents the maximum capacitance, which is the capacitance formed by the ridge F_ridge and the sense electrode 20, and $C_{valley}$ represents the minimum capacitance, which is the capacitance formed by the valley F_valley and the sense electrode 20. The insulation protection layer 40 is interposed between the sense electrode 20 and the skin, the sensing members are formed above the silicon substrate 10, and conductor wires (not shown) are disposed between the sense electrode 20 and the substrate 10.

As shown in FIG. 3, the sensing member is touched by the ridge F_ridge of the finger F to form the sense capacitor C_cell with the capacitance $C_{cell}=C_{ridge}$, and a capacitor C_couple with the capacitance $C_{couple}$ is formed between the couple electrode 30 surrounding the sense electrode 20 and the contact finger. It is to be noted that, in this invention, the couple electrode 30 is configured to interpose between and surround all the sensing members. When the finger F is in contact with the entire imaging device 1, it represents that the contact surface area between the couple electrode 30 and the finger F is far larger than that between the single sensing member and the finger F. That is, $C_{couple}$ is far greater than $C_{ridge}$. For the sake of manufacturing, the sense electrode 20 and the couple electrode 30 are made of the same material and located at the same horizontal level in this embodiment. Of course, the sense electrode 20 and the couple electrode 30 may also be located on different planes.

For the single sensing member structure, the reference electrode 60 may be disposed below each sense electrode 20 in addition to the sense electrode 20 and the peripheral partial couple electrode 30. According to the invention, the adopted silicon integrated circuit manufacturing processes correspond to one polysilicon layer and three metal layers. Thus, the reference electrode 60 of this embodiment is formed by the layout of the second metal layer such that the reference capacitor C_ref is formed between the reference electrode 60 and the sense electrode 20. The dielectric material, such as silicon oxide or silicon nitride, disposed therebetween is the standard dielectric material used in the integrated circuit (IC) manufacturing processes. Of course, those skilled in the art may understand that the process development of the semiconductor integrated circuit may allow more conductor layers to be stacked on the surface of the silicon wafer with the increase of the manufacturing resolution. Thus, the positions of the sense electrode 20 and the reference electrode 60 of the invention may be adjusted without being limited to that the topmost layer and its neighboring layer sequentially serve as the sense electrode 20 and the reference electrode 60. In order to reduce the parasitic capacitance between the reference electrode 60 and the couple electrode 30, the reference electrode 60 is disposed below or under the sense electrode 20, and its area is smaller than that of the sense electrode 20.

In addition to the sense electrode 20, the reference electrode 60 and a portion of the couple electrode 30, each sensing member further includes a sense circuit disposed in the silicon substrate. This sense circuit is basically the negative feedback amplifier 12. Alternatively, many sensing members share a sense circuit. For example, if the array sensing members are adopted, the same row of sensing members may share an amplifier circuit. These modifications can be easily understood by those skilled in the art. In this embodiment, the sense electrode 20 is connected to the negative input terminal 12N of the amplifier 12, the couple electrode 30 is connected to the signal output terminal 12O of the amplifier 12, and the positive input terminal 12P of the amplifier 12 is connected to the silicon substrate, which is grounded. According to such electrical arrangements, when the input signal $V_{in}$ is connected or coupled to the reference electrode 60, the signal output terminal 12O relates to the capacitances between the sensing members and all the metal layer structures, especially the sense electrode 20. In addition to a capacitor C_ridge between the ridge of the finger and the sense electrode 20, a lateral parasitic capacitor C_fringe with the capacitance $C_{fringe}$ also exists between the couple electrode 30 and the sense electrode, and a parasitic capacitor C_par2 is also formed between the sense electrode and the silicon substrate. The capacitor C_couple is formed between the couple electrode 30 and the finger F. A parasitic capacitor C_par3 is formed between the couple electrode 30 and the silicon substrate. The switch SW, which may be a MOS switch, is for resetting the potential between the sense electrode 20 and the couple electrode 30.

Figure 4:
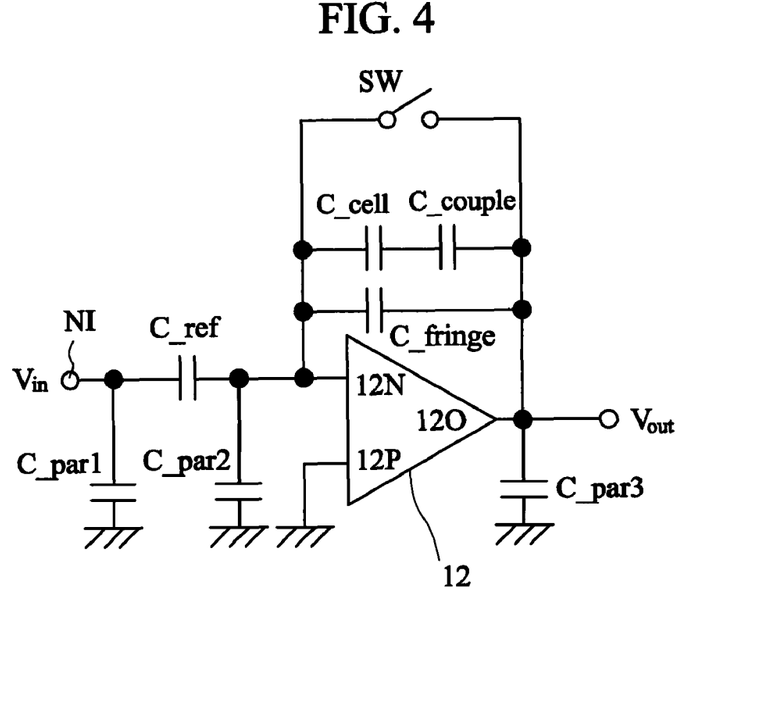
FIG. 4 is an equivalent circuit diagram to the sensing member structure and the circuit configuration of FIG. 3.
Figure 5:
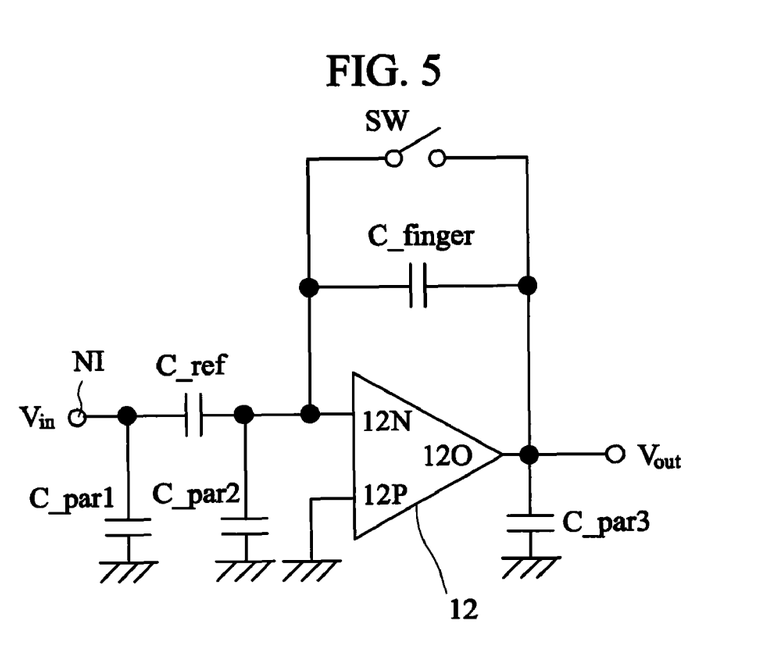
FIG. 5 is a simplified equivalent schematic illustration of FIG. 4.

FIG. 4 is an equivalent circuit diagram to the sensing member structure and the circuit configuration of FIG. 3. FIG. 5 is a simplified equivalent schematic illustration of FIG. 4. As shown in FIGS. 4 and 5, the positive input terminal 12P of the amplifier 12 is connected to the ground (GND), and the positive input terminal 12P and the negative input terminal 12N may be regarded as having the same potential according to the property of the amplifier 12. Thus, the parasitic capacitor C_par2 of the negative input terminal 12N may be regarded as entering a grounding state, so two terminals of the capacitor C_par2 cannot accumulate charges due to the same potential. Such arrangement can effectively eliminate the parasitic capacitance of the input terminal. So, the sensitivity can be greatly enhanced. With regard to the object of the invention, the thickness of the insulation protection layer 40 may be increased. So, the ability of withstanding the electrostatic discharge can be increased, and the ability of withstanding the force impact can be enhanced.

According to FIG. 5, it is obtained that $V_{out}=V_{in}*(C_{ref}/C_{finger})$, wherein $C_{finger}$ is the capacitance of the equivalent capacitor C_finger of the capacitor C_cell and the capacitor C_couple.

According to this formula, it is found that $(C_{ref}/C_{finger})$ may be regarded as an electric gain. This means that the value of $C_{ref}$ has to be increased, and the value of $C_{finger}$ has to be decreased in the design phase.

Since $C_{couple} \gg C_{cell}$, it is obtained, from FIG. 4, that $V_{out}=V_{in}[C_{ref}/(C_{cell}+C_{fringe})]$. When the sense electrode 20 is touched by the ridge or the valley, it is obtained that:

$$V_{ridge}=V_{in}[C_{ref}/(C_{ridge}+C_{fringe})] \quad (1)$$

$$V_{valley}=V_{in}[C_{ref}/(C_{valley}+C_{fringe})] \quad (2)$$

Thus, the voltage difference ΔV between the voltages sensed by the sense electrode 20 at the ridge and the valley may be obtained:

$$\Delta V=V_{in}*C_{ref}*(C_{ridge}-C_{valley})/[(C_{ridge}+C_{fringe})*(C_{valley}+C_{fringe})]$$

The object of the invention is to thicken the insulation protection layer. For example, the thickness of the insulation protection layer has to be increased up to 50 microns. If the material of the protection layer is the typical polymeric material, such as polyimide, its capacitance $C_{ridge}$ approaches several femto-Farads (fF), which is smaller than the lateral capacitor $C_{fringe}$ between the sense electrode 20 and its peripheral couple electrode 30. In addition, the capacitance $C_{valley}$ formed by the valley and the sense electrode is also far smaller than the capacitance $C_{ridge}$ formed by the ridge and the sense electrode. Therefore, a simple formula may be used to represent the object of the invention:

$$\Delta V=V_{in}*C_{ref}*C_{ridge}/C_{fringe} \quad (3)$$

According to Equation (3), it is obtained that $C_{ref}$ and $C_{ridge}$ have to be increased, and $C_{fringe}$ has to be decreased if ΔV has to be increased. However, the three values have the mutual relationships. For example, the reference electrode is disposed below the sense electrode 20, and its maximum range is the same as the area $A_{cell}$ of the sense electrode 20.

After the specification (e.g., the spatial resolution of 500 dpi) of the sensing member array is identified, each unit area is about 50 microns*50 microns, and includes the sense electrode 20 and a portion of the couple electrode 30. That is, as the area of the sense electrode 20 gets larger and its edge gets closer to the couple electrode 30, $C_{fringe}$ also becomes larger. Therefore, the $C_{ref}*C_{ridge}/C_{fringe}^2$ may be optimized to greatly enhance the sensing sensitivity, while the protection layer may be thickened to achieve the object of the invention.

Figure 6:
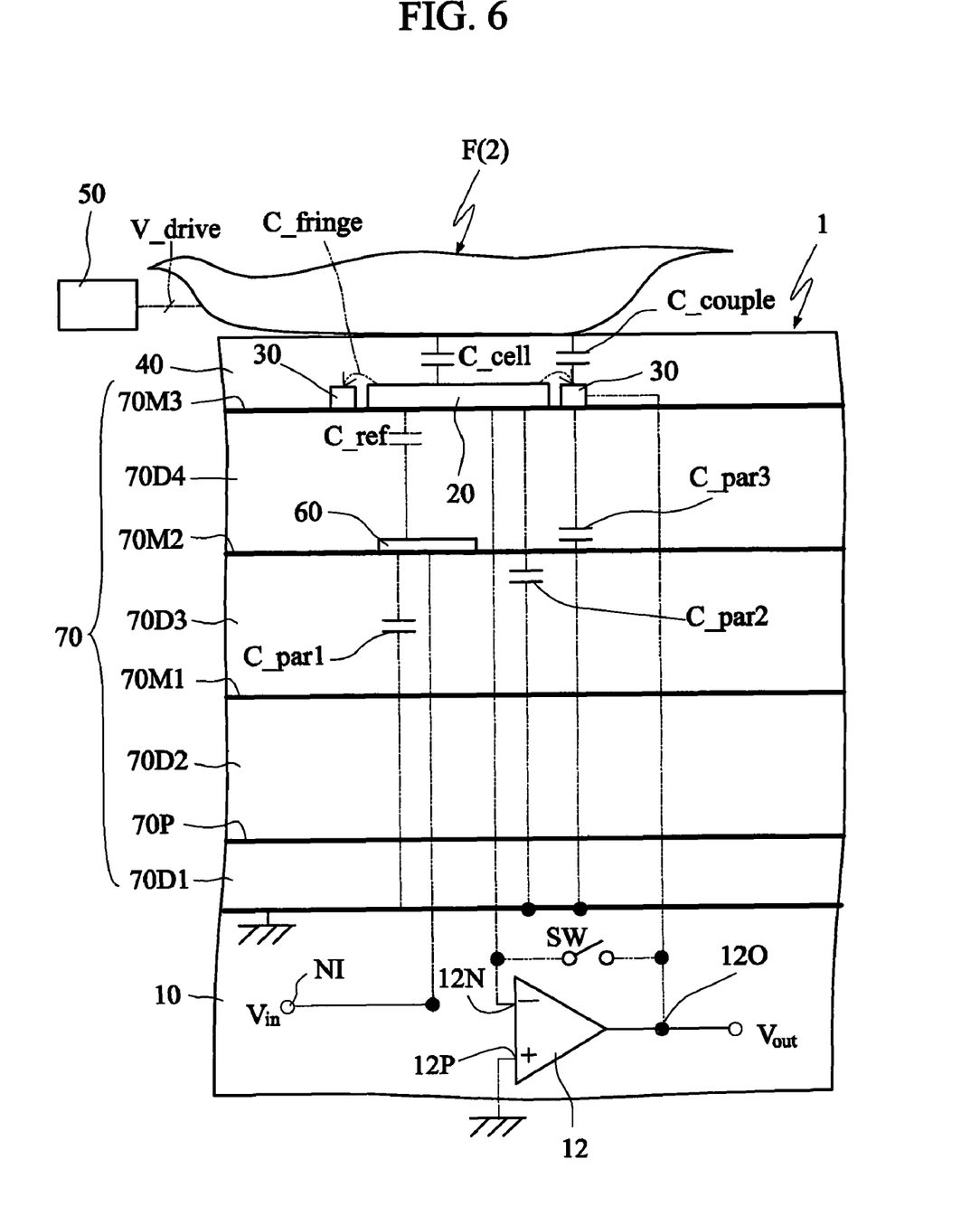
FIG. 6 is a schematic illustration showing an enlarged cross-section of a single sensing member according to a second embodiment of the invention.

FIG. 6 is a schematic illustration showing an enlarged cross-section of a single sensing member according to a second embodiment of the invention. Referring to FIG. 6, the imaging device 1 further includes a driving voltage generator 50 for generating a driving voltage V_drive, which is in direct contact with or coupled to the object 2. The human body is a charged body, and the sensitivity variation during measurement is increased due to different electric properties of different persons. Thus, the potential control may be provided when the imaging device is touched by the skin. As shown in FIG. 6, it is possible to connect the driving voltage V_drive to the skin. The driving voltage V_drive may be provided by the method including, without limitation to, providing a conductor (not shown) to be touched by the skin. Alternatively, a couple capacitor, a resistor or an inductor may be connected between the conductor and the skin to couple the DC or AC signal to the skin to provide the driving voltage V_drive.

Figure 7:
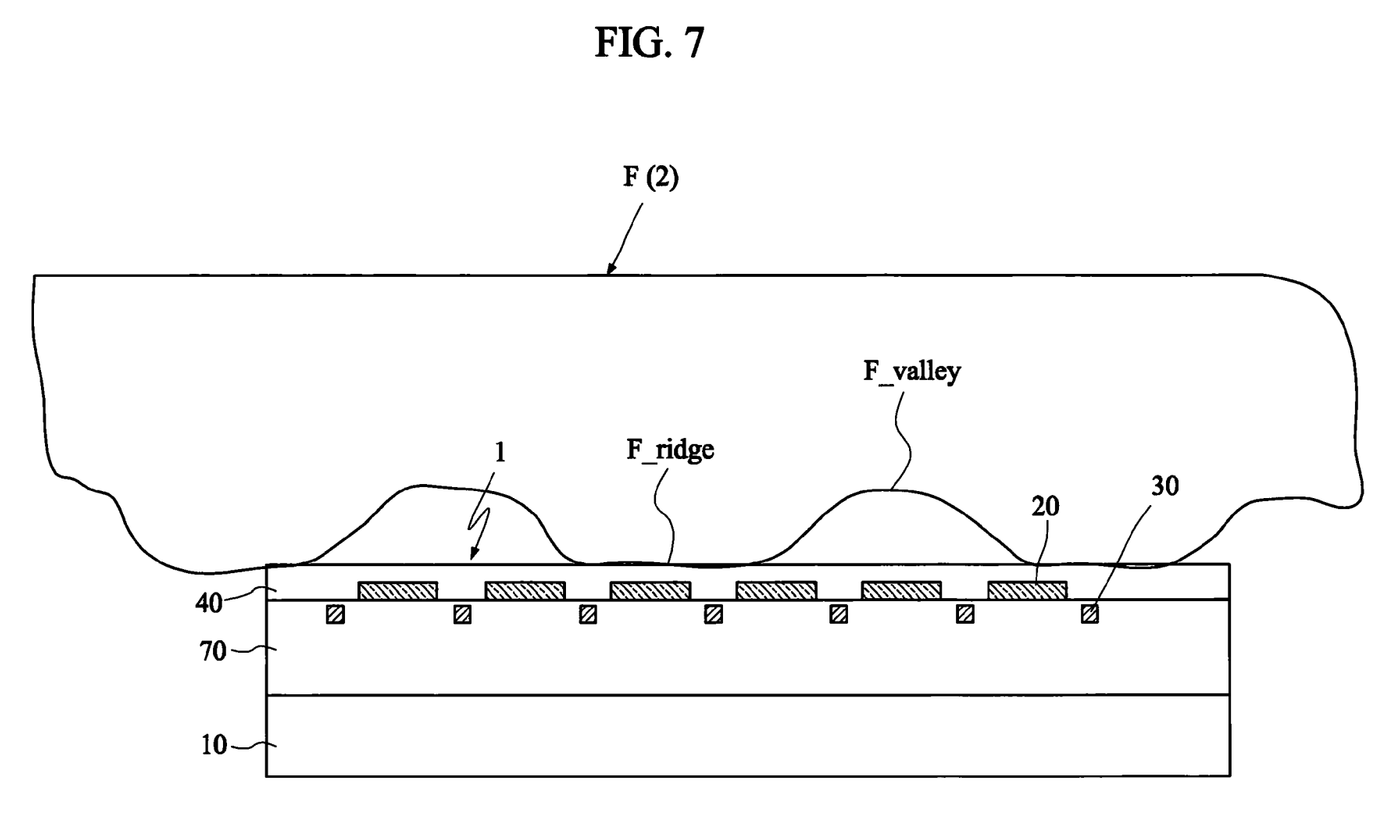
FIG. 7 is a schematic illustration showing another imaging device of the invention in the used state.

FIG. 7 is a schematic illustration showing another imaging device of the invention in the used state. As shown in FIG. 7, the distance from the sense electrode 20 to the substrate 10 is different from the distance from the couple electrode 30 to the substrate 10. That is, the sense electrode 20 and the couple electrode 30 are not located on the same horizontal plane.

Another feature of the invention resides in that multiple sense electrodes 20 correspond to one couple electrode 30. There may be one or multiple negative feedback amplifiers 12. Therefore, in practice, many sense electrodes 20 are located above the substrate 10, and the couple electrode 30 is located above the substrate 10 and around the sense electrodes 20. The insulation protection layer 40 is located between the object 2 and the sense electrodes 20 and the couple electrode 30. Each sense electrode 20 and the object 2 disposed thereabove form a sense capacitor C_cell. The negative input terminal 12N of each of the negative feedback amplifiers 12 is electrically connected to the corresponding sense electrode 20, and the signal output terminal 12O of the negative feedback amplifier 12 is electrically connected to the couple electrode 30. The reference electrodes 60 are respectively disposed between the substrate 10 and the sense electrodes 20, wherein a plurality of reference capacitors C_ref is formed between the sense electrodes 20 and the reference electrodes 60. Because this arrangement pertains to the extension of FIG. 3 and may be easily understood by those skilled in the art, detailed descriptions thereof will be omitted.

Figure 8:
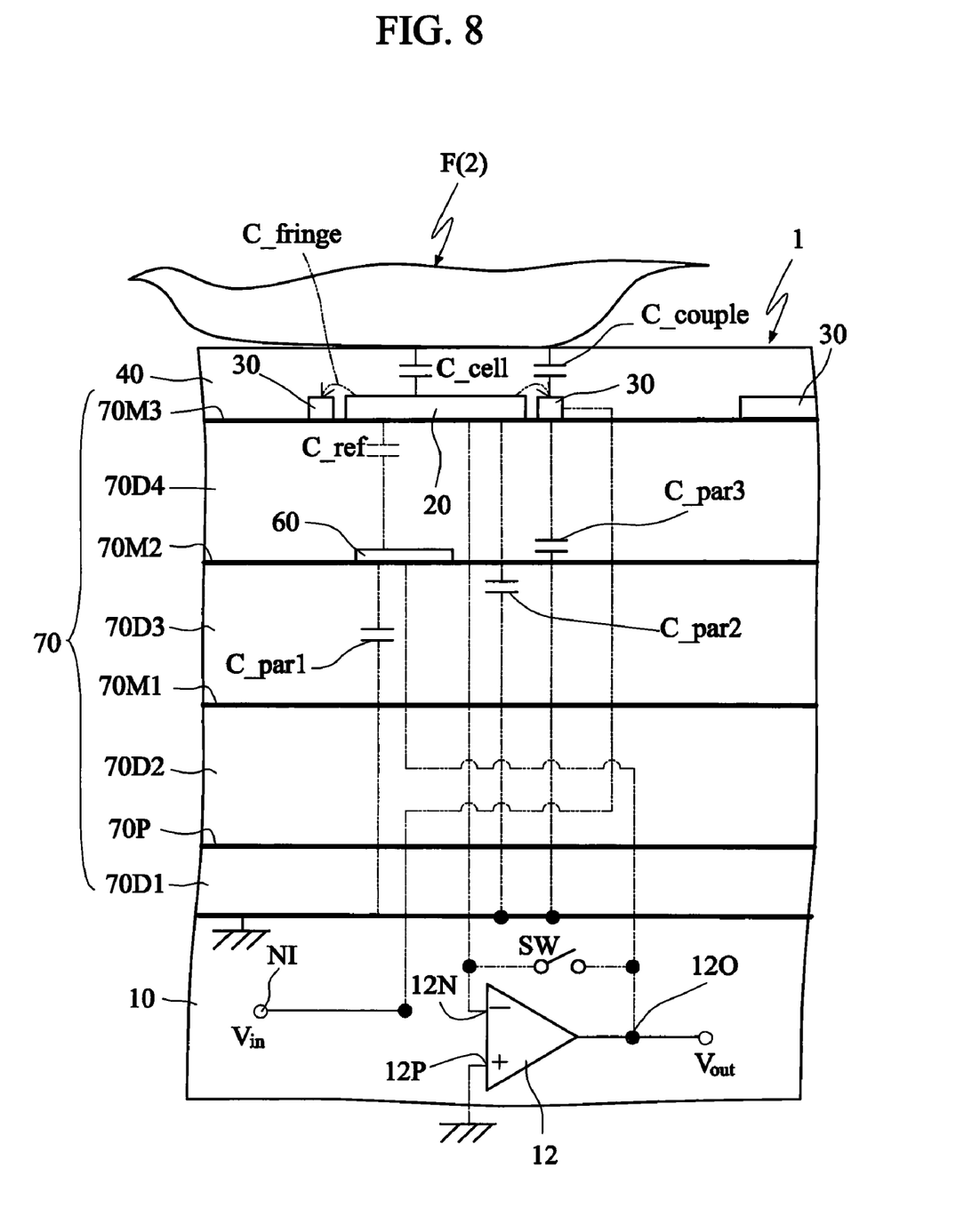
FIG. 8 is a schematic illustration showing an enlarged cross-section of a single sensing member according to a third embodiment of the invention.
Figure 9:
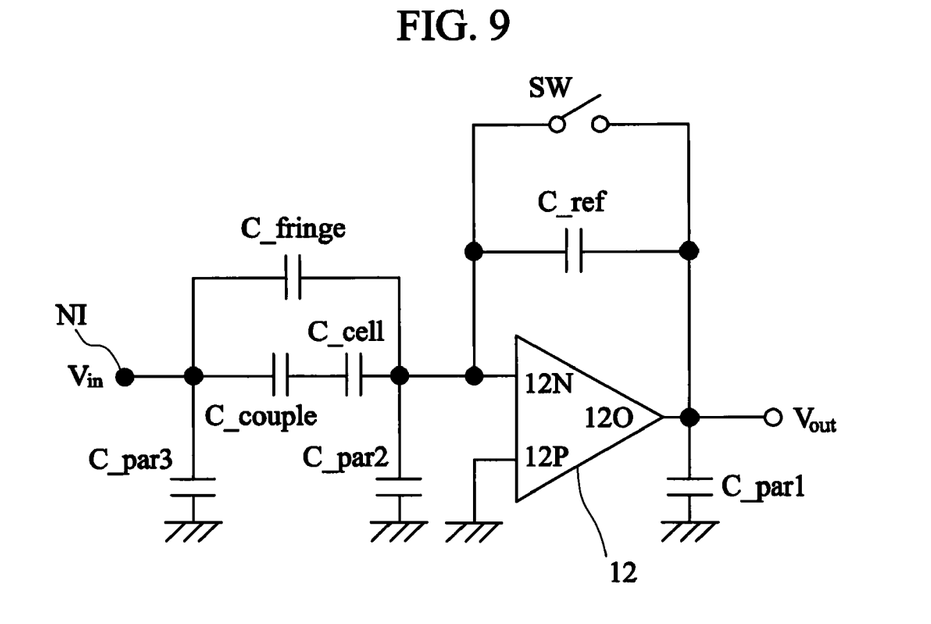
FIG. 9 is an equivalent circuit diagram to the sensing member structure and the circuit configuration of FIG. 8.
Figure 10:
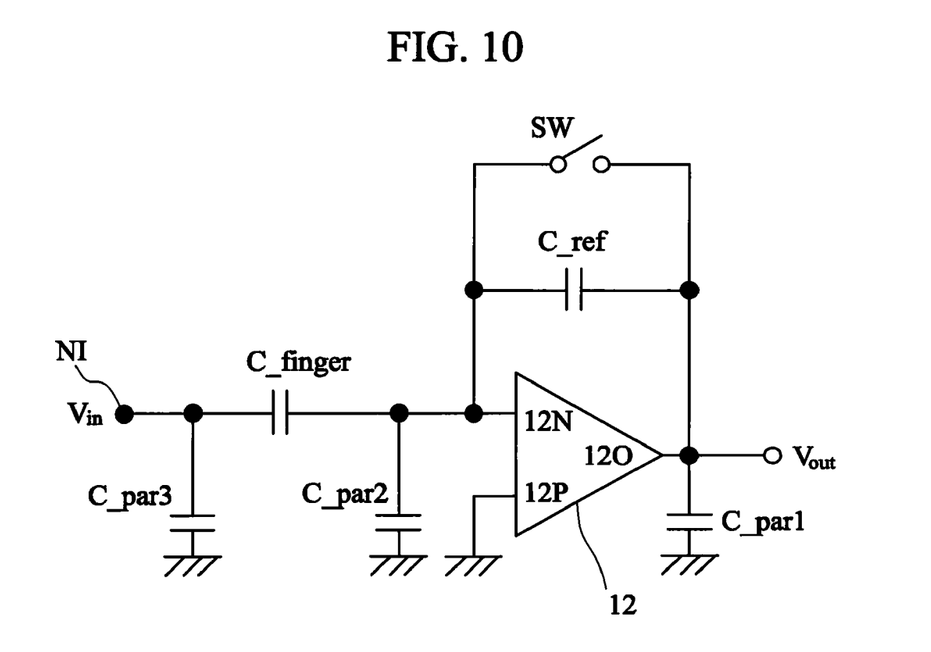
FIG. 10 is a simplified equivalent schematic illustration of FIG. 9.

FIG. 8 is a schematic illustration showing an enlarged cross-section of a single sensing member according to a third embodiment of the invention. As shown in FIG. 8, this embodiment is similar to the first embodiment except that the couple electrode 30 is directly electrically connected to one signal input terminal NI of the imaging device 1, which receives the input signal $V_{in}$. FIG. 9 is an equivalent circuit diagram to the sensing member structure and the circuit configuration of FIG. 8. FIG. 10 is a simplified equivalent schematic illustration of FIG. 9. The voltage difference ΔV between the ridge and the valley may be derived from FIGS. 9 and 10, as mentioned hereinbelow. The parasitic capacitors C_par1 and C_par3 are respectively located at the output terminal and the input terminal of the overall circuit, and cannot greatly influence the overall sense signal. Like FIG. 5, the parasitic capacitors C_par2 are coupled to the negative input terminal 12N of the amplifier 12.

As shown in FIGS. 9 and 10, the positive input terminal 12P of the amplifier 12 is connected to the ground (GND), and the property of the amplifier 12 is that the positive input terminal 12P and the negative input terminal 12N may be regarded as having the same potential. Thus, the parasitic capacitor C_par2 of the negative input terminal 12N may be regarded as in the grounding state. So, no charge is accumulated in the capacitor C_par2 because two terminals of C_par2 have the same potential. Such the arrangement can effectively eliminate the parasitic capacitor of the input terminal, so the sensing sensitivity can be greatly enhanced. With regard to the object of the invention, the thickness of the insulation protection layer 40 can be increased to enhance the ability of withstanding the electrostatic discharge and the ability of withstanding the force impact.

According to FIG. 10, it is obtained that $V_{out}=V_{in}*(C_{finger}/C_{ref})$, wherein $C_{finger}$ is the capacitance of the equivalent capacitor C_finger of the capacitor C_cell, the capacitor C_couple and the lateral parasitic capacitor $C_{fringe}$.

According to this formula, it is found that $(C_{finger}/C_{ref})$ may be regarded as an electric gain. This means that the value of $C_{ref}$ has to be decreased, and the value of $C_{finger}$ has to be increased in the design phase.

The capacitance of the equivalent capacitor C_finger may be obtained according to the following equation:

$$C_{finger}=C_{fringe}+(C_{cell}*C_{couple})/(C_{cell}+C_{couple}) \quad (4)$$

Since $C_{couple} \gg C_{cell}$, Equation (4) may be simplified as $V_{out}=V_{in}*(C_{fringe}+C_{cell})/C_{ref}$. When the sense electrode 20 is touched by the ridge or the valley, the obtained output voltages $V_{ridge}$ and $V_{valley}$ are as follows:

$$V_{ridge}=V_{in}*(C_{ridge}+C_{fringe})/C_{ref} \quad (5)$$

$$V_{valley}=V_{in}*(C_{valley}+C_{fringe})/C_{ref} \quad (6)$$

Thus, the voltage difference ΔV between the voltages sensed by the sense electrode 20 at the ridge and the valley may be obtained:

$$\Delta V=V_{in}*(C_{ridge}-C_{valley})/(C_{ref}) \quad (7)$$

According to Equation (7), it is obtained that the capacitance difference between $C_{ridge}$ and $C_{valley}$ has to be increased and the capacitance of $C_{ref}$ has to be decreased if ΔV has to be increased. For example, the reference electrode is disposed below the sense electrode 20, and its maximum range is the same as the area $A_{cell}$ of the sense electrode 20. After the specification (e.g., the spatial resolution of 500 dpi) of the sensing member array is identified, each unit area is about 50 microns*50 microns and includes the sense electrode 20 and a portion of the couple electrode 30. That is, the capacitance of each of the capacitors $C_{ridge}$ and $C_{valley}$ gets larger as the area of the sense electrode 20 gets larger. Thus, the distance from the sense electrode 20 to the finger may be enlarged. So, the sensing sensitivity can be greatly enhanced while the thickness of the protection layer can be increased to achieve the object of the invention.

Figure 11:
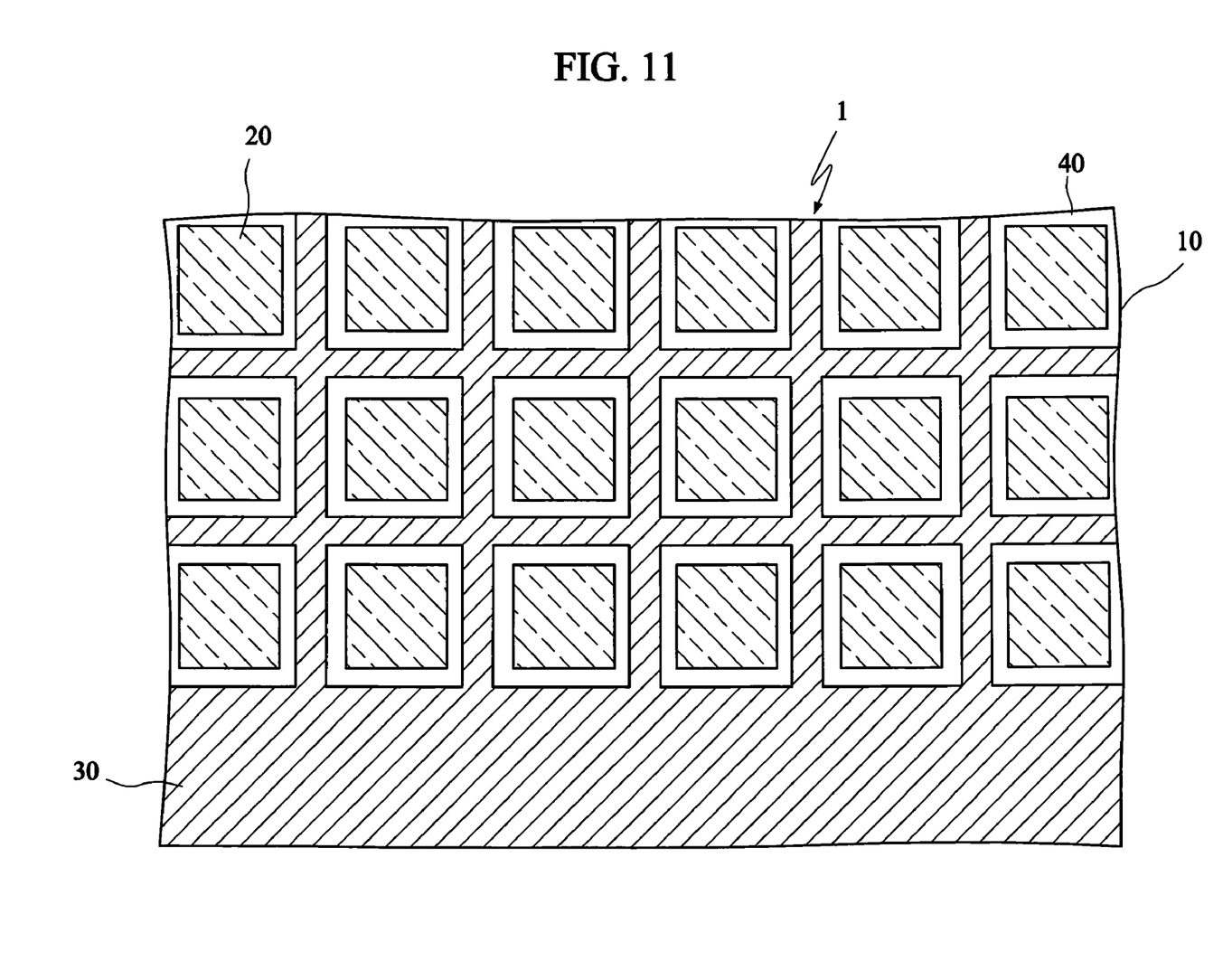
FIG. 11 is a schematic top view showing a portion of the sensing member array of the imaging device according to another example of the invention.

Therefore, the sense electrodes 20 of the invention are coupled to the negative input terminal of the negative feedback amplifier, and the maximum feature of the invention is the design of the couple electrode 30, which may be coupled to the signal input terminal or the signal output terminal. The couple electrode 30 is not in direct contact with the skin of the finger, and an insulating layer exists between the couple electrode 30 and the finger. Such an effect can greatly enhance the ability of this device of withstanding the electrostatic charge discharge (ESD). If the skin touches the couple electrode, it represents that the couple electrode has to be exposed to the air, and the electrostatic charges coming from the finger are directly directed to the exposed couple electrode and then transferred to the inside of the chip so that the chip is damaged by the electrostatic discharge. The configuration of the couple electrode 30 may be that shown in FIG. 1 or 11 having the grid-like structure to cover each sense electrode or even extend to the other regions inside or outside the chip. In addition, the couple electrode 30 may also be disposed on one side (see FIG. 11), two sides or three sides of the sense electrodes and disposed around each sense electrode, and the total area of the couple electrode 30 is possible enlarged such that the sensing effect of the imaging device is optimized. Alternatively, the couple electrode 30 may not be disposed around the sense electrode.

According to the embodiments of the invention, the thickness of the insulation protection layer may be increased to enhance the abilities of withstanding the electrostatic discharge and the force impact.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications. In an extended modification of the invention, for example, the sense electrode and the couple electrode may not be directly integrated with the sensing integrated circuit (IC) on the semiconductor substrate (Si substrate) (also referred to as system on chip (SOC), but are separated from the sensing integrated circuit (IC). For example, the sense electrode and the couple electrode or the reference electrode may be formed on the polymeric substrate, an insulation substrate or another semiconductor substrate and connected to the sensing IC by way of package. In another embodiment, the polymeric substrate or the insulation substrate may be inverted and exposed to the outside so that it can be touched by the finger, and the substrate serves as a protection layer to provide a surface to be touched by the finger. Of course, the surface of the substrate to be in contact with the finger may further include a contact layer to be in contact with the finger. The contact layer provides the property same as that of the material of the protection layer. In brief, the protection layer, the substrate or the contact layer to be in direct contact with the object can provide the ability of withstanding the force impact and the erosion, as well as the hydrophobic and lipophobic properties.

What is claimed is:

1. An imaging device for sensing an image of an object, the imaging device comprising:
    a negative feedback amplifier;
    a substrate;
    a sense electrode disposed above the substrate;
    a couple electrode disposed above the substrate;
    an insulation protection layer covering the sense electrode and the couple electrode, wherein the sense electrode and the object form a sense capacitor, the couple electrode and the object form a couple capacitor, a negative input terminal of the negative feedback amplifier is directly electrically connected to the sense electrode, and the couple electrode is directly electrically connected to one of a signal output terminal of the negative feedback amplifier and a signal input terminal of the imaging device; and
    a reference electrode disposed between the substrate and the sense electrode, wherein:
    a reference capacitor is formed between the sense electrode and the reference electrode, and the reference electrode is disposed below the sense electrode;
    the couple electrode is directly electrically connected to the signal output terminal of the negative feedback amplifier; and
    the reference electrode is directly electrically connected to the signal input terminal.

2. The imaging device according to claim 1, wherein the couple electrode is disposed around the sense electrode and/or disposed on one side of the sense electrode.

3. The imaging device according to claim 1, wherein a distance from the sense electrode to the substrate is equal to a distance from the couple electrode to the substrate.

4. The imaging device according to claim 1, wherein a distance from the sense electrode to the substrate is unequal to a distance from the couple electrode to the substrate.

5. The imaging device according to claim 1, wherein the negative feedback amplifier is formed in the substrate.

6. The imaging device according to claim 1, further comprising:
    a driving voltage generator for generating a driving voltage, which is in direct contact with or coupled to the object.

7. The imaging device according to claim 1, wherein the signal input terminal receives an input signal, the signal output terminal of the negative feedback amplifier outputs an output signal, the output signal is equal to a product of an electric gain and the input signal, and the electric gain is equal to $(C_{ref}/C_{finger})$, wherein $C_{finger}$ is a capacitance of an equivalent capacitor of the sense capacitor and the couple capacitor, and $C_{ref}$ is a capacitance of the reference capacitor.

8. The imaging device according to claim 1, further comprising a switch, which is directly electrically connected to the negative input terminal of the negative feedback amplifier and the signal output terminal of the negative feedback amplifier, for resetting a potential between the sense electrode and the couple electrode.

9. The imaging device according to claim 1, wherein a positive input terminal of the negative feedback amplifier is grounded.

10. An imaging device for sensing an image of an object, the imaging device comprising:
    a negative feedback amplifier;
    a substrate;
    a sense electrode disposed above the substrate;
    a couple electrode disposed above the substrate;
    an insulation protection layer covering the sense electrode and the couple electrode, wherein the sense electrode and the object form a sense capacitor, the couple electrode and the object form a couple capacitor, a negative input terminal of the negative feedback amplifier is directly electrically connected to the sense electrode, and the couple electrode is directly electrically connected to one of a signal output terminal of the negative feedback amplifier and a signal input terminal of the imaging device; and
    a reference electrode disposed between the substrate and the sense electrode, wherein:
    a reference capacitor is formed between the sense electrode and the reference electrode, and the reference electrode is disposed below the sense electrode;
    the couple electrode is directly electrically connected to the signal input terminal of the imaging device, which receives an input signal; and
    the reference electrode is directly electrically connected to the signal output terminal.

11. The imaging device according to claim 10, wherein the signal output terminal of the negative feedback amplifier outputs an output signal, the output signal is equal to a product of an electric gain and the input signal, and the electric gain is equal to $(C_{finger}/C_{ref})$, wherein $C_{finger}$ is a capacitance of an equivalent capacitor of the sense capacitor, the couple capacitor and a lateral parasitic capacitor existing between the couple electrode and the sense electrode, and $C_{ref}$ is a capacitance of the reference capacitor.

12. The imaging device according to claim 10, further comprising a switch, which is directly electrically connected to the negative input terminal of the negative feedback amplifier and the signal output terminal of the negative feedback amplifier, for resetting a potential between the sense electrode and the reference electrode.

* * * * *